United States Patent

Pan

(10) Patent No.: US 11,114,148 B1
(45) Date of Patent: Sep. 7, 2021

(54) EFFICIENT FERROELECTRIC RANDOM-ACCESS MEMORY WORDLINE DRIVER, DECODER, AND RELATED CIRCUITS

(71) Applicant: Wuxi Petabyte Technologies Co., Ltd., Wuxi (CN)

(72) Inventor: Feng Pan, Fremont, CA (US)

(73) Assignee: WUXI PETABYTE TECHNOLOGIES CO., LTD., Jiangsu (CN)

(*) Notice: Subject to any disclaimer, the term of this patent is extended or adjusted under 35 U.S.C. 154(b) by 0 days.

(21) Appl. No.: 16/851,026

(22) Filed: Apr. 16, 2020

(51) Int. Cl.
*G11C 11/22* (2006.01)
*H01L 27/11585* (2017.01)
*G11C 7/10* (2006.01)
*G11C 7/12* (2006.01)

(52) U.S. Cl.
CPC ........ *G11C 11/2257* (2013.01); *G11C 11/221* (2013.01); *H01L 27/11585* (2013.01); *G11C 7/1078* (2013.01); *G11C 7/12* (2013.01)

(58) Field of Classification Search
None
See application file for complete search history.

(56) References Cited

U.S. PATENT DOCUMENTS

| | | | | |
|---|---|---|---|---|
| 5,513,142 A * | 4/1996 | Arimoto | ............. | G11C 11/4085 365/189.11 |
| 6,229,755 B1 * | 5/2001 | Oh | ............. | G11C 8/08 365/185.01 |
| 6,370,063 B2 * | 4/2002 | Kim | ............. | G11C 16/08 365/185.23 |
| 6,621,745 B1 * | 9/2003 | Manea | ............. | G11C 8/08 365/185.23 |
| 6,621,759 B1 * | 9/2003 | Waller | ............. | G11C 8/08 365/189.06 |
| 7,616,514 B2 | 11/2009 | Lee et al. | | |
| 8,270,222 B2 | 9/2012 | Liao | | |
| 9,940,987 B2 * | 4/2018 | Jung | ............. | G11C 8/10 |
| 2007/0008806 A1 * | 1/2007 | Kim | ............. | G11C 16/08 365/230.06 |
| 2009/0116305 A1 * | 5/2009 | Son | ............. | G11C 11/406 365/189.09 |
| 2010/0302894 A1 * | 12/2010 | Takahashi | ............. | G11C 8/08 365/230.06 |
| 2013/0321363 A1 * | 12/2013 | Su | ............. | G09G 3/20 345/204 |

* cited by examiner

*Primary Examiner* — Tan T. Nguyen
(74) *Attorney, Agent, or Firm* — Bayes PLLC

(57) ABSTRACT

A wordline driver may include the following: a first transistor having a first node at the input and a second node at an input voltage; a second transistor having a first node at the input node, a second node at a third node of the first transistor, and a third node at ground; a third transistor having a first node at the input voltage, a second node at the first internal node and a third node at a second internal node; a fourth transistor having a first node at an internal node, a second node at a boosted voltage, and a third node at a wordline; a fifth transistor having a first node at an internal node, a second node at the wordline, and a third node at ground; and a sixth transistor between the wordline, the boosted voltage, and the second internal node.

22 Claims, 5 Drawing Sheets

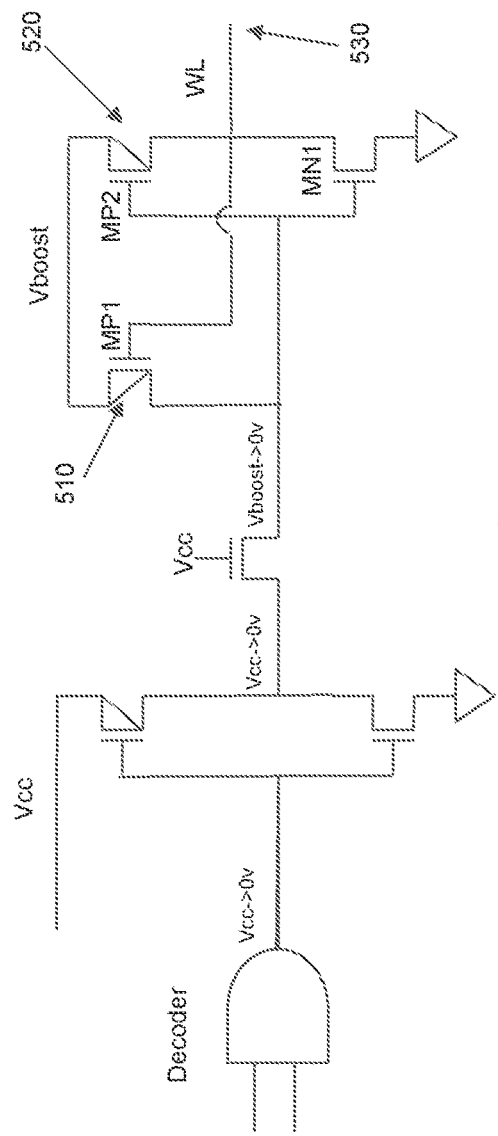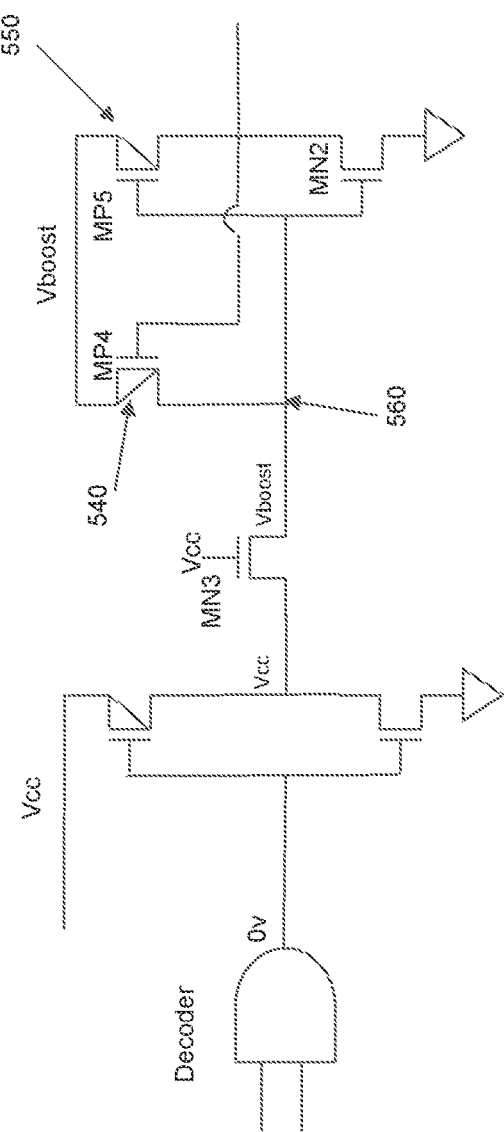
FIG. 5A
FIG. 5B

EFFICIENT FERROELECTRIC RANDOM-ACCESS MEMORY WORDLINE DRIVER, DECODER, AND RELATED CIRCUITS

BACKGROUND

Embodiments of the present disclosure relate to a decoder. Certain embodiments may relate more particularly to a random access memory (RAM) circuit of particular benefit as a ferroelectric RAM (FRAM) wordline decoder.

Memory devices can be formed by circuits that are configured to store logic states. These logic states can be stored in volatile or non-volatile ways. While Flash RAM has been a popular volatile choice for bit storage, ferroelectric RAM (FRAM) promises lower power usage, faster write performance, and greater maximum read/write endurance. FRAM is one of several alternatives to Flash RAM. One other alternative is dynamic RAM (DRAM). DRAM and FRAM can differ from one another. Like DRAM, FRAM relies on a destructive read process, requiring a write-after-read architecture. Unlike DRAM, FRAM is a non-volatile memory technology. Thus, FRAM has its own unique challenges and issues.

By applying either high or low voltage levels to memory cell transistors that comprise a memory cell array, bits can be stored as logical ones and zeros. Application of a voltage to gate lines or wordlines of the memory cell can be used for reading and writing data for the cell.

In order to control the application of voltage to the gate lines of selected cells in a memory cell array, wordline voltage control circuits may be employed. Memory cells may be accessible by applying activation voltages to wordlines and bitlines, which may be drain lines. More particularly, wordlines may be used to activate memory cells and bitlines may provide data to or retrieve data from activated memory cells. In a wordline voltage control circuit, various voltage levels or polarities may be applied to selected wordlines of a memory cell array by a decoder circuit (e.g., a wordline driver) in order to activate selected memory cells. In other words, when memory access is desired, an activation voltage may be applied to the corresponding wordline by the wordline driver to perform a read or write.

In certain cases, a wordline decoder and driver circuit is collectively referred to as a wordline decoder. This circuit, considered collectively, can drive wordlines during the operation of an FRAM circuit.

Conventional wordline drivers often require relatively large area footprints. In other words, conventional wordline drivers often take up a relatively large area of a chip and have a relatively high ratio of transistors to wordlines. In addition, large transistor loadings would increase the size of a boot-strapped capacitor for word line boosting due to larger capacitive loadings.

SUMMARY

Embodiments of a FRAM wordline decoder are disclosed herein.

According to one aspect of the present disclosure, a wordline driver may include an input node connected to an output of a wordline decoder. The wordline driver may also include a first transistor having a first node connected to the input node and a second node connected to an input voltage source. The wordline driver may further include a second transistor having a first node connected to the input node, a second node connected to a third node of the first transistor at a first internal node, and a third node connected to ground. The wordline driver may additionally include a third transistor having a first node connected to the input voltage source, a second node connected to the first internal node and a third node connected to a second internal node. The wordline driver may also include a fourth transistor having a first node connected to the second internal node, a second node connected to a boosted voltage source, and a third node connected to a wordline. The wordline driver may further include a fifth transistor having a first node connected to the second internal node, a second node connected to the wordline, and a third node connected to ground. The wordline driver may additionally include a sixth transistor having a first node connected to the wordline, a second node connected to the boosted voltage source, and a third node connected to the second internal node.

In some embodiments, the first transistor and the second transistor respectively may include a p-type transistor and an n-type transistor.

In some embodiments, the fourth transistor and the fifth transistor respectively may include a p-type transistor and an n-type transistor.

In some embodiments, the third transistor may include an n-type transistor.

In some embodiments, the sixth transistor may include a p-type transistor.

In some embodiments, the first node of the first transistor, the first node of the second transistor, the first node of the third transistor, the first node of the fourth transistor, the first node of the fifth transistor, and the first node of the sixth transistor each may include a respective gate of the corresponding transistor.

In some embodiments, the input voltage source may include a common voltage source of a chip bearing the wordline driver.

In some embodiments, the boosted voltage source may include a boosting capacitor.

According to another aspect of the present disclosure, a wordline driver may include an input node connected to an output of a wordline decoder and configured to receive an input signal from the wordline decoder. The wordline driver may also include a first complementary pair of transistors connected to the input node and configured to provide an inverse of the input signal to an internal node of the wordline driver in a first power domain. The wordline driver may further include a second complementary pair of transistors in a second power domain and configured to receive the inverse of the input signal and to output a re-inverted version of the input signal to a wordline. The second complementary pair may be configured to provide the re-inverted version of the input signal at a boosted voltage.

In some embodiments, the wordline driver may further include a feedback transistor configured to be controlled by the re-inverted version of the input signal and configured to provide the boosted voltage to the internal node when the re-inverted version of the input signal is low.

In some embodiments, the feedback transistor may include an n-type transistor.

In some embodiments, the wordline driver may further include a blocking transistor configured to leave the internal node floating when the input voltage drops below a gate voltage of the blocking transistor.

In some embodiments, the blocking transistor may include an n-type transistor.

In some embodiments, a gate of the blocking transistor may be configured to receive an input voltage level from a common voltage source.

In some embodiments, the first complementary pair of transistors may include a p-type transistor and an n-type transistor.

In some embodiments, the second complementary pair of transistors may include a p-type transistor and an n-type transistor.

In some embodiments, the first complementary pair of transistors may be configured to select between an input voltage level from a common voltage source and ground based on the input signal.

In some embodiments, the second complementary pair of transistors may be configured to select between the boosted voltage and ground based on the inverse of the input signal.

In some embodiments, the boosted voltage may be provided by a boosting capacitor configured to provide a voltage pulse configured to pass a common voltage to a top plate of a ferroelectric random access memory capacitor.

According to still another aspect of the present disclosure, a wordline decoder and driver circuit may include a wordline decoder connected to an input voltage source and having an output configured to provide a selection signal. The circuit may also include an input node connected to an output of the wordline decoder. The circuit may further include a first transistor having a first node connected to the input node and a second node connected to the input voltage source. The circuit may additionally include a second transistor having a first node connected to the input node, a second node connected to a third node of the first transistor at an internal node, and a third node connected to ground. The circuit may also include a third transistor having a first node connected to the internal node, a second node connected to a boosted voltage source, and a third node connected to a wordline. The circuit may further include a fourth transistor having a first node connected to the internal node, a second node connected to the wordline, and a third node connected to ground. The circuit may additionally include a fifth transistor having a first node connected to the wordline, a second node connected to the boosted voltage source, and a third node connected to the internal node. The circuit may also include a sixth transistor connected at a first node to the first transistor and the second transistor and at a second node to the internal node.

In some embodiments, the sixth transistor may be configured to be activated by the input voltage source.

In some embodiments, the first transistor, second transistor, and sixth transistor may be configured to operate in a first power domain drawing from a first voltage source at a first level and the third transistor, fourth transistor, and fifth transistor may be configured to operate in a second power domain drawing from a second voltage source at a second level.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 5A and 5B illustrate parasitic capacitances for selected and unselected wordlines respectively, according to certain embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Certain embodiments of the present disclosure avoid issues in previous or background systems, such as those issues mentioned above, and may provide various benefits and/or advantages. For example, certain embodiments may minimize or reduce parasitic capacitance, thereby permitting the use of a smaller boost capacitor and saving die space in wordline design for FRAM chips.

Figure 1:
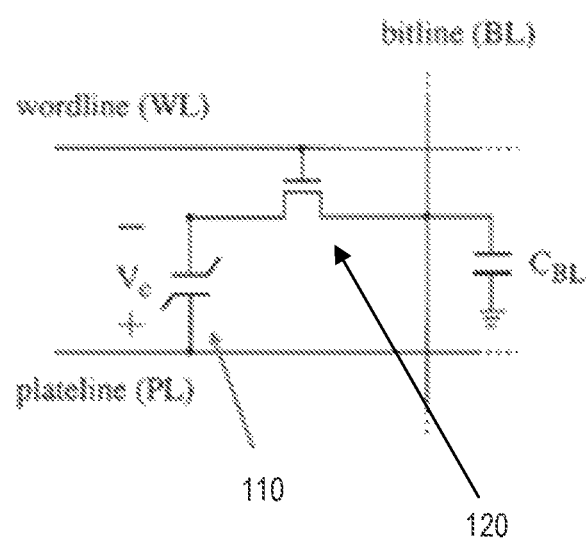
FIG. 1 illustrates an FRAM circuit according to certain embodiments.

FIG. 1 illustrates an FRAM circuit according to certain embodiments. As shown in FIG. 1, a bit can be stored as a voltage polarity of capacitor 110, having a voltage of $V_c$. Capacitor 110 is typically made from a film of ferroelectric material placed between two electrodes, which is why it is referred to as ferroelectric RAM. There can be a corresponding transistor 120 associated with capacitor 110. The voltage polarization stored in capacitor 110 persists even after the electric field producing the voltage has been removed. This is the reason this device is used for storing bits. Unlike some other forms of bit storage, the read process of the bit stored in capacitor 110 is destructive. The capacitor $C_{BL}$ is a circuit element representative of a total parasitic capacitance of the BL.

To determine the polarity of capacitor 110, both the wordline (WL) and the plateline (PL), sometimes referred to as a drive line, can be brought high. A sensing amplifier (not shown) can then be used to evaluate whether the voltage provided on the BL is above or below a threshold reference voltage. If the voltage is above the reference voltage, the BL can be driven to high, whereas if the voltage is below the reference voltage, the BL can be driven to low. The driving of the BL to high or low can be used to restore the polarity in the capacitor.

Figure 2:
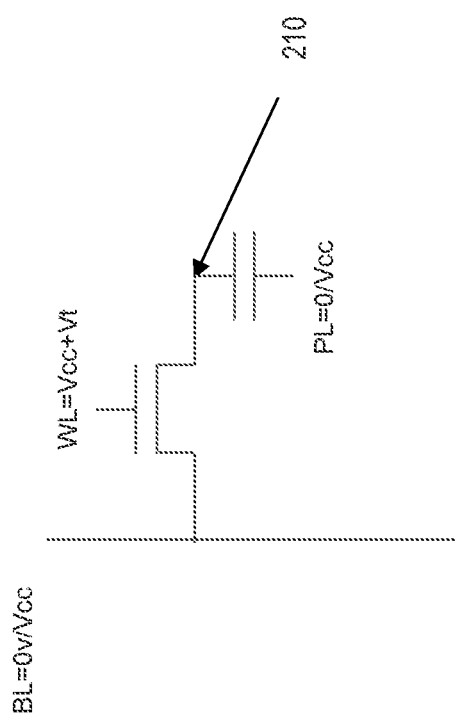
FIG. 2 illustrates an FRAM circuit, with a focus on voltage needs.

FIG. 2 illustrates an FRAM circuit, with a focus on voltage needs. As shown in FIG. 2, a bitline (BL) and a plateline (PL) may have a voltage of ground (0 V) or Vcc. The wordline voltage may need to be boosted to a value of Vcc+Vt, in order to pass the bitline voltage Vcc to the top plate of the FRAM capacitor, indicated as 210 in FIG. 2. Thus, Vboost can be Vcc+Vt.

Figure 3:
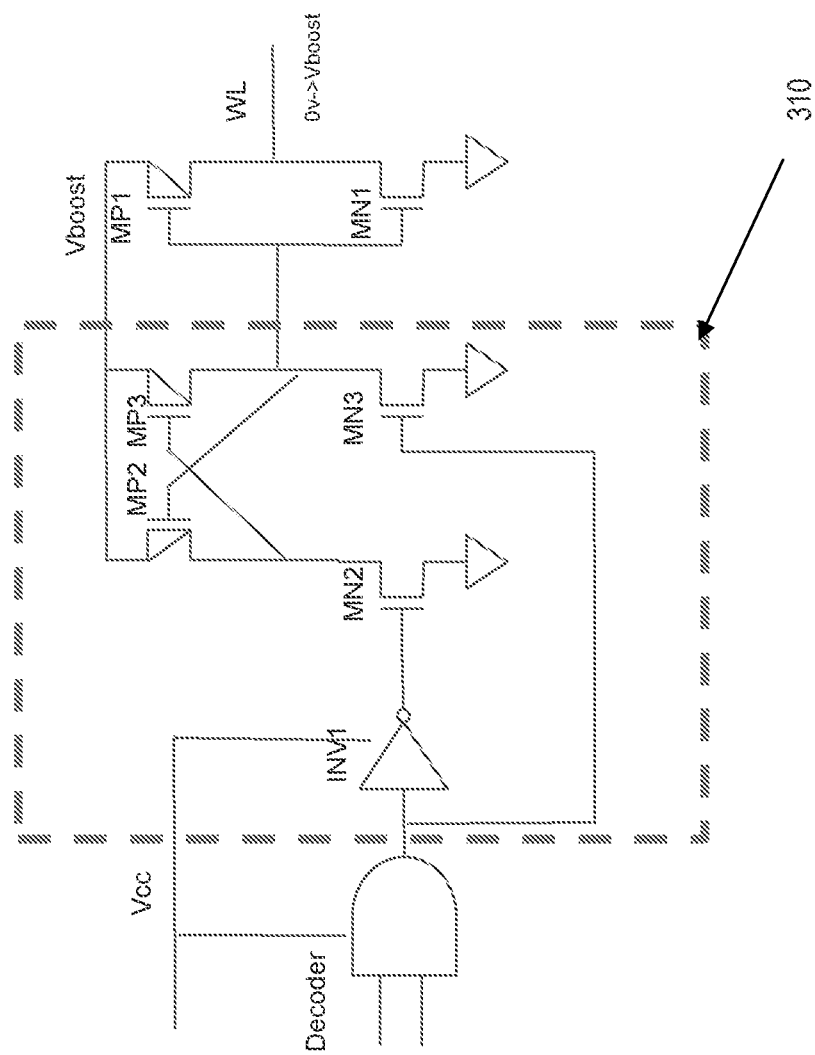
FIG. 3 illustrates a background wordline driver.

FIG. 3 illustrates a background wordline driver. As shown in FIG. 3, a level shifter 310 can be used in the provision of Vboost. As shown in FIG. 3, the level shifter 310 can include an inverter, INV1, as well as at least four transistors, MN2, MN3, MP2, and MP3. The additional inverter, INV1, is used to get a complement of the polarity of the decoding. In some cases, even more than four transistors may be needed. The result of this large number of transistors and extra inverter is a die size increase in the fabrication process. Also, the transistors that see Vboost may be in a relatively higher power domain, and consequently may be larger than transistors that see only Vcc. Additionally, in this approach, there may be additional loading on Vboost due to one selected wordline driver and 63 unselected wordline drivers. In particular, each of the unselected wordline drivers will, in this background example, need to provide Vboost because Vboost is used in the selection of ground.

When considering a representative wordline driver circuit, it may be easy to overlook the impact of the design of the unselected wordline drivers, because one typically visualizes a selected wordline and an unselected wordline. Nevertheless, as mentioned above, the number of unselected wordlines may vastly outnumber the selected wordlines. The higher this ratio of unselected to selected wordlines, the bigger impact the unselected wordlines may have.

On a given chip there may be numerous wordlines. In certain cases, only 1 in 16, 1 in 32, or 1 in 64 wordlines may be enabled. A capacitor can be used for providing a Vboost to these wordlines. Moreover, in this background approach, an internal node of the driver may be kept at Vboost when the wordline is unselected. Thus, in cases where the vast majority of wordlines need a boosted voltage, the wordline boosting capacitance may be high. Moreover, this need for high capacitance may be, in part, the result of the size of parasitic capacitance relative to wordline boosting capacitance. If the parasitic capacitance is high, wordline boosting capacitance may need to be even higher. A higher capacitance generally implies a larger physical device, which may increase die size for chips. A higher capacitance generally implies higher power consumption.

In general, $V_{boost}$, the boost voltage may be modeled as depending on an initial voltage, $V_{init}$, and a kick voltage, $V_{kick}$. The boost voltage may be applied to a boost capacitor, $C_{boost}$. The size of the boost capacitor $C_{boost}$ needed may depend on the relative size of the parasitic capacitance, $C_{parasitic}$. For example, the following equation may represent the relationship between boost capacitance and parasitic capacitance:

$$V_{boost} = V_{init} + V_{kick} \frac{C_{boost}}{C_{boost} + C_{parasitic}}.$$

The boosted voltage may be provided as a pulse having a predetermined width. The predetermined width may be used to pass Vcc to the top plate of an FRAM capacitor.

Figure 4:
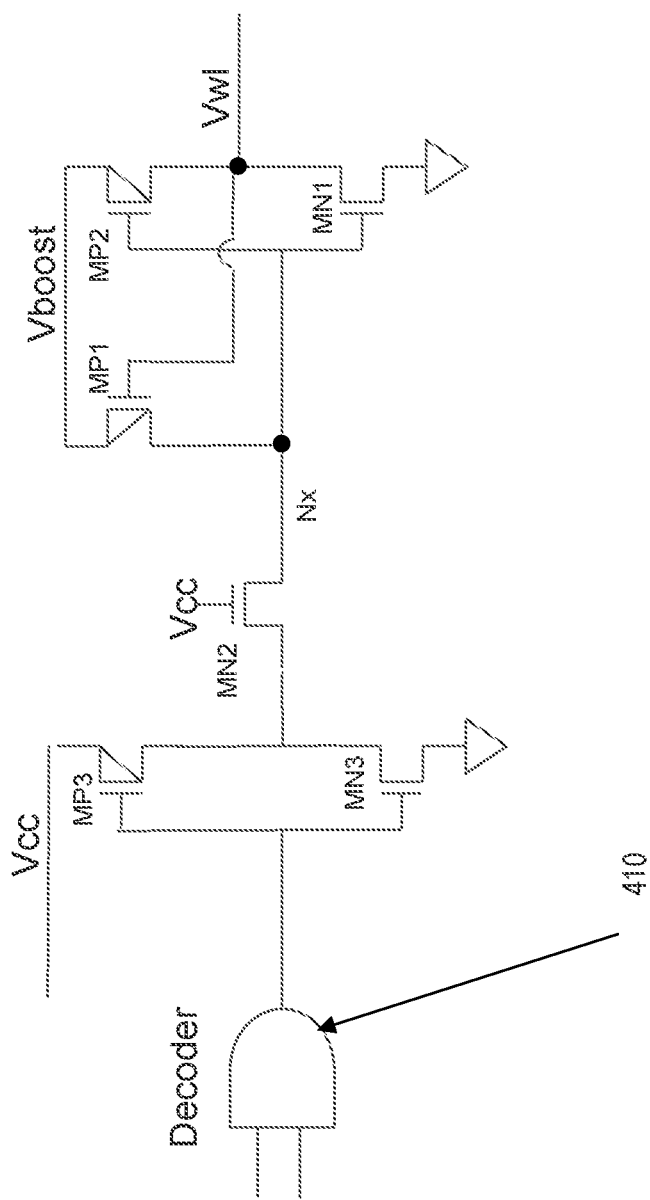
FIG. 4 illustrates a wordline decoder, according to certain embodiments.

FIG. 4 illustrates a wordline decoder, according to certain embodiments. As shown in FIG. 4, an input voltage source (not shown) can provide voltage Vcc over an input voltage line. The input voltage source may ultimately be powered by, for example, a lithium-ion battery of a mobile device. The decoder of FIG. 4 may be provided on a single chip, together with a memory circuit, such as a ferroelectric memory device.

A decoder 410 can provide a signal for a wordline. This signal may need to be boosted from the input voltage Vcc to Vboost, when the signal is high. Accordingly, an output of decoder 410 may be presented as a common input to a pair of complementary transistors MP3 and MN3, which may respectively be a p-type transistor and n-type transistor. When the decoder 410 provides a high signal, this complementary pair of transistors may provide a ground as an input to the source of n-type transistor MN2. On the other hand, when decoder 410 provides a low signal, this complementary pair of transistors may provide Vcc as the input to the drain of n-type transistor MN2. As transistor MN2 is always configured to transmit, intermediate node Nx can provide an inverse of the output of decoder 410. Intermediate node Nx can be considered an internal node of the device. Thus, transistors MN3, MP3, and MN2 can function to provide an inversion of the signal provided by decoder 410. Node Nx can serve to control a further complementary transistor pair, MN1 and MP2. This further complementary pair may re-invert the signal from decoder 410. Thus, when the signal from decoder 410 is high, node Nx may be low, and consequently, output of the further complementary pair may be high, namely Vboost may be presented as wordline voltage, Vwl.

A complementary pair of transistors may include one each of two different types of transistors, such as an n-type transistor and a p-type transistor. Because the transistors are different types, the same signal seen at the gate of both transistors may place exactly one of the pair in a transmit mode, whereas the inverse signal seen at the gate of both transistors may place the other one of the pair in a transmit mode. In this way, a source voltage or ground can be selected by the gates of the pair. When the gates are directly connected or connected without any active elements between them, this may be referred to as a common node. When a p-type transistor of a pair is connected to a voltage source and an n-type transistor of the pair is connected to the ground, the pair may provide an inversion of the signal applied at their common node gate.

The wordline voltage, Vwl, may also serve as an input to a final transistor of the circuit, namely MP1. When wordline voltage Vwl is high, Nx may be at ground, and p-type transistor MP1 may stand between VBoost and ground.

In this example, MP1, MP2, MN1, and MN2 can be viewed as the core part of the wordline driver. Likewise, MP3, MN3 and the decoder can be viewed as a supporting part of the wordline driver. The supporting part may operate in a first power domain, the Vcc power domain, whereas the remaining transistors may, in whole or in part, operate in a second power domain, the Vboost power domain. The Vboost power domain may be a higher power domain, and accordingly may rely on larger sized transistors. MN2 in FIG. 4 may be considered to be a blocking transistor and may stand at the boundary between the two power domains, in some sense operating in each of them. As a blocking transistor, MN2 may be configured to leave an internal node, Nx, floating when the input voltage provided by MP3 and MN3 drops below a gate voltage of blocking transistor MN2.

This wordline driver may reduce or minimize parasitic capacitance loading to the Vboost node, as will be explained in more detail below. The Vboost initial voltage may be different from that of Vcc and may be a function of FRAM capacitance device requirements.

In certain embodiments, transistor MP1 can be viewed as a feedback transistor. When Vwl is low, corresponding to an unselected case, MP1 may provide Vboost to node Nx, while MP3 and MN2 provide Vcc to the drain of MN2. Transistor MN2 is in cut off state, and there is no leakage current between source/drain of MN2. Node Nx is at Vboost to maintain Vwl at 0v, which implies that this wordline is unselected.

FIGS. 5A and 5B illustrate parasitic capacitances for selected and unselected wordlines respectively, according to certain embodiments. As shown in FIGS. 5A and 5B, there may be six parasitic capacitances, three for a selected wordline driver in FIG. 5A and three for each unselected wordline driver in FIG. 5B. The architecture of each of the driver circuits may be the same as one another and may be as shown and discussed with reference to FIG. 4. In some cases, there may be 63 unselected wordlines to every selected wordline.

Referring to FIG. 5A, in the case of a selected wordline, a first parasitic capacitance 510 may be at transistor MP1, a second parasitic capacitance 520 may be at transistor MP2, and a third parasitic capacitance 530 may be at the wordline. First parasitic capacitance 510, second parasitic capacitance 520, and third parasitic capacitance 530 may respectively be designated: Cw1(MP1), Cw2(MP2)+Cov(MP2)+Cg(MP2), and Cw1+Cov(MN1)+Cj(MN1). In other words, the first parasitic capacitance 510 may be an n-well capacitance of the capacitor MP1, the second parasitic capacitance 520 may be an n-well capacitance of the capacitor MP2 plus source/drain gate overlap capacitance of MP2 plus the gate capacitance of MP2, and the third parasitic capacitance 530 may be an n-well capacitance of the capacitor MN1 plus source/drain gate overlap capacitance of MN1 plus the capacitance of the wordline itself.

Referring to FIG. 5B, in the case of each of the unselected wordlines, a fourth parasitic capacitance 540 may be at transistor MP4, a fifth parasitic capacitance 550 may be at transistor MP5, and a sixth capacitance 560 may be at an internal node of the device. These may respectively be designated: Cw4(MP4)+Cov(MP4), Cw5(MP5)+Cov(MP5), and Cg(MP2)+Cov(MP2)+Cj(MN3)+Cov(MN3). In other words, the fourth parasitic capacitance 540 may be an n-well capacitance of the capacitor MP4 plus source/drain gate overlap capacitance of MP4, and the fifth parasitic capacitance 550 may be an n-well capacitance of the capacitor MP5 plus source/drain gate overlap capacitance of MP5. Meanwhile, the sixth capacitance 560 may be the sum of the gate capacitance of the transistor MP2, the source/drain gate overlap capacitance of MP2, the n-well capacitance of the transistor MN3, and the source/drain gate overlap capacitance of transistor MN3.

In the discussion herein, certain devices are described as having nodes. A node may be, for example, an electrical contact or lead line. A device, such as a transistor, may have an electrically connectable gate, source, and drain. The connection to the gate, the connection to the source, and the connection to the drain may each be considered a node. Thus, in certain embodiments, a transistor may be a three-node device. The use of first, second, and third with reference to nodes may be arbitrary in that in one instance a gate may correspond to a first node, while on other instances, a first node may be a source or drain node.

Certain embodiments of the wordline driver disclosed herein may be more compact than previous or background wordline drivers. Furthermore, certain embodiments of the wordline drivers disclosed herein may reduce the necessary size of a wordline boosting capacitor, thereby further reducing die size relative to previous and background approaches.

In certain cases, the size of a boosting capacitor may be large relative to transistor size. In such cases, certain embodiments may provide a reduction in size even when the same or more transistors are used. Moreover, certain embodiments may accomplish this size reduction without the need to compromise noise performance.

The foregoing description of the specific embodiments will so reveal the general nature of the present disclosure that others can, by applying knowledge within the skill of the art, readily modify and/or adapt for various applications of such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A wordline driver, comprising:
   an input node connected to an output of a wordline decoder;
   a first transistor having a first node connected to the input node and a second node connected to an input voltage source;
   a second transistor having a first node connected to the input node, a second node connected to a third node of the first transistor at a first internal node, and a third node connected to ground;
   a third transistor having a first node connected to the input voltage source, a second node connected to the first internal node and a third node connected to a second internal node;
   a fourth transistor having a first node connected to the second internal node, a second node connected to a boosted voltage source, and a third node connected to a wordline;

a fifth transistor having a first node connected to the second internal node, a second node connected to the wordline, and a third node connected to ground; and a sixth transistor having a first node connected to the wordline, a second node connected to the boosted voltage source, and a third node connected to the second internal node.

2. The wordline driver of claim 1, wherein the first transistor and the second transistor respectively comprise a p-type transistor and an n-type transistor.

3. The wordline driver of claim 1, wherein the fourth transistor and the fifth transistor respectively comprise a p-type transistor and an n-type transistor.

4. The wordline driver of claim 1, wherein the third transistor comprises an n-type transistor.

5. The wordline driver of claim 1, wherein the sixth transistor comprises a p-type transistor.

6. The wordline driver of claim 1, wherein the first node of the first transistor, the first node of the second transistor, the first node of the third transistor, the first node of the fourth transistor, the first node of the fifth transistor, and the first node of the sixth transistor each comprises a respective gate of the corresponding transistor.

7. The wordline driver of claim 1, wherein the input voltage source comprises a common voltage source of a chip beating the wordline driver.

8. The wordline driver of claim 1, wherein the boosted voltage source comprises a boosting capacitor.

9. A wordline driver, comprising:
an input node connected to an output of a wordline decoder and configured to receive an input signal from the wordline decoder;
a first complementary pair of transistors connected to the input node and configured to provide an inverse of the input signal to an internal node of the wordline driver in a first power domain; and
a second complementary pair of transistors in a second power domain and configured to receive the inverse of the input signal and to output a re-inverted version of the input signal to a wordline,
wherein the second complementary pair is configured to provide the re-inverted version of the input signal at a boosted voltage.

10. The wordline driver of claim 9, further comprising:
a feedback transistor configured to be controlled by the re-inverted version of the input signal and configured to provide the boosted voltage to the internal node when the re-inverted version of the input signal is low.

11. The wordline driver of claim 10, wherein the feedback transistor comprises an p-type transistor.

12. The wordline driver of claim 9, further comprising a blocking transistor configured to leave the internal node floating when the input voltage drops below a gate voltage of the blocking transistor.

13. The wordline driver of claim 12, wherein the blocking transistor comprises an n-type transistor.

14. The wordline driver of claim 12, wherein a gate of the blocking transistor is configured to receive an input voltage level from a common voltage source.

15. The wordline driver of claim 9, wherein the first complementary pair of transistors comprises a p-type transistor and an n-type transistor.

16. The wordline driver of claim 9, wherein the second complementary pair of transistors comprises a p-type transistor and an n-type transistor.

17. The wordline driver of claim 9, wherein the first complementary pair of transistors is configured to select between an input voltage level from a common voltage source and ground based on the input signal.

18. The wordline driver of claim 9, wherein the second complementary pair of transistors is configured to select between the boosted voltage and ground based on the inverse of the input signal.

19. The wordline driver of claim 9, wherein the boosted voltage is provided by a boosting capacitor configured to provide a voltage pulse configured to pass a common voltage to a top plate of a ferroelectric random access memory capacitor.

20. A circuit, comprising:
a wordline decoder connected to an input voltage source and having an output configured to provide a selection signal;
an input node connected to an output of the wordline decoder;
a first transistor having a first node connected to the input node and a second node connected to the input voltage source;
a second transistor having a first node connected to the input node, a second node connected to a third node of the first transistor at an internal node, and a third node connected to ground;
a third transistor having a first node connected to the internal node, a second node connected to a boosted voltage source, and a third node connected to a wordline;
a fourth transistor having a first node connected to the internal node, a second node connected to the wordline, and a third node connected to ground;
a fifth transistor having a first node connected to the wordline, a second node connected to the boosted voltage source, and a third node connected to the internal node; and
a sixth transistor connected at a first node to the first transistor and the second transistor and at a second node to the internal node.

21. The circuit of claim 20, wherein the sixth transistor is configured to be activated by the input voltage source.

22. The circuit of claim 20, wherein the first transistor, second transistor, and sixth transistor are configured to operate in a first power domain drawing from a first voltage source at a first level and the third transistor, fourth transistor, and fifth transistor are configured to operate in a second power domain drawing from a second voltage source at a second level.

* * * * *